United States Patent
Harneit et al.

(10) Patent No.: US 7,019,207 B2
(45) Date of Patent: Mar. 28, 2006

(54) METHOD FOR PRODUCING A SOLAR MODULE WITH THIN-FILM SOLAR CELLS WHICH ARE SERIES-CONNECTED IN AN INTEGRATED MANNER AND SOLAR MODULES PRODUCED ACCORDING TO THE METHOD, ESPECIALLY USING CONCENTRATOR MODULES

(75) Inventors: Wolfgang Harneit, Berlin (DE); Arnulf Jaeger-Waldau, Berlin (DE); Martha Christina Lux-Steiner, Berlin (DE)

(73) Assignee: Hahn-Meitner-Institut Berlin GmbH., Berlin (DE)

( * ) Notice: Subject to any disclaimer, the term of this patent is extended or adjusted under 35 U.S.C. 154(b) by 607 days.

(21) Appl. No.: 10/240,303

(22) PCT Filed: Mar. 29, 2001

(86) PCT No.: PCT/DE01/01295

§ 371 (c)(1),
(2), (4) Date: Oct. 28, 2002

(87) PCT Pub. No.: WO01/75976

PCT Pub. Date: Oct. 11, 2001

(65) Prior Publication Data

US 2003/0121542 A1   Jul. 3, 2003

(30) Foreign Application Priority Data

Mar. 30, 2000 (DE) ............................... 100 17 610

(51) Int. Cl.
*H01L 27/142* (2006.01)
*H01L 31/052* (2006.01)
*H01L 31/18* (2006.01)

(52) U.S. Cl. ..................... 136/244; 136/258; 438/80

(58) Field of Classification Search ........ 136/243–265; 438/57–98; 257/53–56, 184–189, 431–466
See application file for complete search history.

(56) References Cited

U.S. PATENT DOCUMENTS 4,400,577 A * 8/1983 Spear ......................... 136/259
5,035,753 A * 7/1991 Suzuki et al. ............... 136/249

* cited by examiner

*Primary Examiner*—Nam Nguyen
*Assistant Examiner*—Jeffrey T. Barton
(74) *Attorney, Agent, or Firm*—Karl Hormann

(57) ABSTRACT

Known methods of producing large-surface integrated thin-film solar modules with an amorphous, poly- or microcrystalline absorber layer always comprise division and conversion structuring processes which can cause instabilities in the structuring and which are relatively expensive. According to the inventive method which can be used to fabricate substrate solar cells and superstrate solar cells, the mask which is used provides for structuring itself during the deposition of layers for the rear electrode and the absorber layer through its geometrical form. The use of a mask which can be reused as an independent element after use in this method allows for a relatively free range of possible geometric forms. This also makes possible applications inside and outside of buildings, including in the area of a window, from an esthetic and informal point of view. These types of application are also supported by the possibility of a structural connection between the solar modules produced according to the inventive method and light-collecting concentrator modules, in order considerably to increase their average and total energy conversion efficiency.

11 Claims, 6 Drawing Sheets

METHOD FOR PRODUCING A SOLAR MODULE WITH THIN-FILM SOLAR CELLS WHICH ARE SERIES-CONNECTED IN AN INTEGRATED MANNER AND SOLAR MODULES PRODUCED ACCORDING TO THE METHOD, ESPECIALLY USING CONCENTRATOR MODULES

BACKGROUND OF THE INVENTION

1. Field of the Invention

The invention relates to a method of fabricating a solar module with structured and integrated series-connected thin-film solar cells and to solar modules made by the method. The support layer of such solar cells may be either a substrate or a superstrate.

Thin-film solar cells of either type are provided with light-absorbing absorber layers of cost-efficient amorphous, poly- or micro-crystalline semiconductor materials which may be precipitated or built up on large-surface substrates or superstrates by a many different methods. The small layer thickness of the absorber layers and the possibility of providing a structure during fabrication further reduce the manufacturing costs, so that thin-film solar cells constitute a cost-efficient alternative to the cost-intensive silicon solar cells mostly used at present and which as mono-crystalline single or multiple layer systems following their manufacture must first be sawed apart into individual cells and then, in the manner of high-value semiconductor products, be further processed by complex steps. By photovoltaic conversion of solar energy into electric power, thin-film solar cells generate voltage levels of less than 1 Volt. In order to attain technically useful power at a voltage of typically 12 Volts or 24 Volts, a sufficient number of individual cells are connected in series. In the case of thin-film solar cells, the series connection may be integrated into the layer-forming process. This involves subdividing layers formed as whole surfaces into small strips by suitable structuring methods, for instance paste-scribing methods and lift-off techniques as well as mechanical and, more particularly, layer processing methods. The purpose of the structuring is to create an electrical connection between the electrodes at the front and rear surfaces of adjacent strip-shaped solar cells.

2. The Prior Art

From U.S. Pat. No. 4,675,467 there is known a method of series-connecting an integrated thin-film solar module in which both electrodes are incorporated in prefabricated strip-form into an unstructured absorber layer. The conductive connections between the corresponding electrodes of adjacent solar cells are then formed in a structuring step by laser irradiation from the transparent substrate surface into an area covered by the electrode strips. Appropriate areas of the absorber layer are thus converted into low-ohmic areas by a precisely defined quantity of energy, which does, however, entail the risk of damaging the semiconductor material. Because of the lack of spatial structuring of the absorber layer there is no electrical insulation between the semiconductor material of adjacent solar cells which leads to power-reducing short circuit currents. The laser treatment requires a highly precise power level, positioning and focusing of the applied laser beam in order to yield the desired spatially precise conversion effect. This may lead to layer separations and damages in the immediate vicinity of the structuring operation. Furthermore, it is necessary always to use a transparent substrate of precisely defined homogeneous layer thickness so that the laser beam may penetrate from the substrate side and that a power-level dependent depth of penetration into the layers to be separated or transformed may be precisely set.

A similar process involving prefabricated electrode strips has been described in U.S. Pat. No. 4,999,308, in which the laser treatment for area conversion is used at the same time to separate the absorber layer to form insulation trenches by blowing away semiconductor material which is thus lost. In this combined process, the energy dosaging poses a problem which to some extent leads to an uncertainty especially in respect of the conversion areas, notwithstanding the fact that processing is carried out from the upper side of the solar cells rather than through the substrate. The use of two scribing processes for the consecutive separation of absorber layer and front electrode at different laterally displaced positions is known from U.S. Pat. No. 5,296,674. The separation is accomplished by indirect laser irradiation through the protective layer substrate so that the direct connection between adjacent solar cells is maintained by the absorber layer. This method requires multiple positioning of a transparent substrate while accepting short circuit currents.

A method of series connecting an integrated thin-film solar cell module is known from WO-9503628 in which all functional layers are separately structured during special process steps. In accordance with the method, a metal layer previously precipitated as a single layer on a transparent substrate is separated by any desired structuring method into closely adjacent strips to form a strip-shaped rear electrode. Following the subsequent whole-surface coating with a thin semiconductor layer for forming an absorber layer and with a front layer to form a front electrode, two additional separate structuring steps are carried out by laser irradiation from the side of the substrate. The first laser irradiation serves to structure or pattern the strips of the absorber layer and of the front electrode; the second laser irradiation serves to convert into a low-ohmic area that portion of the absorber layer which is positioned in the covered area between opposite electrode strips of adjacent solar cells, thus forming an integrated conductive series-connection between the solar cells. Therefore, in the known method the structuring involves a treble separation treatment. The first treatment serves to separate the front electrode and the absorber layer. Laser-assisted removal of the sensitive semiconductor layer always involves the risk of damage to, or alteration of, the layer. The second treatment for area conversion again requires a precisely energized laser and includes the problems described supra.

The described methods are footed on the common task of optimization in the sense of maximized power output or minimized surface area of the fabricated solar modules of striped structured thin-film solar cells of either type of support layers. Compared to monocrystalline solar cells such solar cells are of low energy efficiency which at lower light conditions is rapidly further reduced relative to normal conditions (light concentration AM 1.5). Accordingly, at common deviations of seasonal and day-by-day light intensities, depending upon the weather and at indoor applications (down to 10% of the maximum available radiation), thin-film solar cells are subject to significant power losses. This explains the insignificant use of thin-film solar cells in areas where solar radiation varies significantly and in indoor areas in general. In connection with monocrystalline solar cells, light collecting concentrator modules consisting of optical elements to maintain at, or raise to, an optimum efficiency range the light intensity in respect of monocrystalline solar cells have become known from many publications. However, the goal of such known measures is not to maximize power but, rather, to bring about as significant a reduction as possible of the very expensive required surface of the solar module.

For instance, U.S. Pat. No. 5,118,361 discloses a solar module of monocrystalline tandem solar cells made of GeAs/GaSb which is built into a housing the cover of which is formed by a concentrator module made up of individual Fresnel lenses of polymeric material and positioned, together with light-collecting funnels, in front of individual solar cells. These are disposed within the module on a flexible connection ribbon of conductive and non-conductive strips. From European Patent 0,657,048 there is known an automated microchip-like connection in a very similar arrangement of monocrystalline GaAs solar cells aiming at surface minimization. Concentrator arrangements provided with linear focus lenses in, or as part of, a module cover which are particularly suitable for strip-like solar modules are known, for instance, from U.S. Pat. No. 4,711,972 for monocrystalline silicon solar cells and from U.S. Pat. No. 5,505,789 for monocrystalline integrated solar cell chips made of GaAs. German Patent specification 197 44 840 A1 discloses a solar module having a forward concentrator module made of plastic Fresnel lenses which as a structured unit tilts or slides in accordance with the position of the sun to provide for an improved power balance. Finally, European Patent 0,328,053 describes strip-like solar modules with a forward Fresnel lens which are mounted in the corner of a window pane of a double window and which are to provide the electricity for operating blinds in the between the windows.

However, neither the mentioned nor any other publication discloses an application for concentrator modules for amorphous, poly- or micro-crystalline thin-film solar modules in particular in any kind of arrangement, so that such modules have hitherto shown a relatively poor power balance which is strongly dependent on the time of day and on the weather. More particularly, little or no consideration has been given to optical structuring methods in connection with applications of known solar modules, including thin-film solar cells precipitated as large surfaces on glass substrates, which has led to relatively uniform solar module structures used primarily in the field of industry. Esthetically patterned solar modules may be found, for instance, in roof pans (see German Patents 42 279 29 and 43 176 74) or wrist watches which also may take different colors into consideration (see European Patent 0,895,141).

OBJECTS OF THE INVENTION

With reference to the above explanations and proceeding from the state of the art relating to the method of fabricating a solar module with structured and integrated series-connected thin-film solar cells which is most closely related to the inventive method, it is a first object of the present invention to provide an improved fabrication method of very low complexity as regards structuring. In this connection, those aspects of the improvement addressed to the fabrication of substrate and superstrate cells alike are to relate especially to a simplified method and, at the same time, to a fabrication process which can be more easily controlled and reproduced. Moreover, it is an object of the invention to achieve an exceptionally low use of material and an assured separation of the individual layers at a complete insulation of the individual solar cells. Based on these consideration, the cost efficiency of the fabrication method is to be improved. In addition, the basic task of optimizing a solar module is to be accomplished by suitable forms and measures, especially in connection with concentrator modules of solar modules fabricated in accordance with the inventive method, thus leading to a special flexibility in terms of their applicability.

SUMMARY OF THE INVENTION

In the accomplishment of these objects, the invention provides for thin-film solar cells of the substrate type and for thin-film solar cells of the superstrate type. In this connection, the methods of fabricating either type substantially correspond to each other, except that they are quasi inversed. This may be explained by the fact that but for their inversed layer sequence substrate and superstrate solar cells are of the same basic construction. In this connection, the substrate functions as a bottom support layer, and light impinges on the solar cell from above, whereas the superstrate functions as a top support layer, and light impinges through the superstrate. However, in order to provide for a comprehensible description, the advantages of the invention will primarily be described on the basis of the method of fabricating a substrate type solar cell, particularly since the advantages also result from the inverse method. Following this, the differences between the two methods will be briefly set forth.

The inventive method makes possible continuous structuring of all functional layers at an extremely low complexity of pattern formation. By using a mask, particularly one with a striped pattern, two structuring steps otherwise required are avoided. On the one hand, this relates to the usual structuring of the rear electrode after application on the substrate or, in the inverse method, after application of the absorber layer. In accordance with the invention, the rear electrode is structured directly with a superposed mask during coating with a corresponding metal layer. This leads to no loss of material since the mask may be used again. On the other hand, the method step of the otherwise conventional and particularly critical subsequent structuring of the semiconductor absorber layer is avoided as well. This is of particular advantage as problems arising during mechanical or, more particularly, laser-assisted cutting of the absorber layer are avoided. Damage to individual layers, imprecise borders between layers and non-reproducible layer conditions resulting from laser irradiations cannot occur.

The absorber layer like the rear electrode is structured by use of the mask. This leads to the integrated series connection of the individual solar cells by a simple but especially effective method step. Before application of the absorber layer on the substrate and mask, the mask is moved slightly in a lateral direction leading to the formation of narrow upper and lower ribs which after removal of the mask which are contacted by the front layer subsequently applied as an uninterrupted surface, the front layer being the front electrode. In the area of the lower ribs the rear electrode sections at one side are completely enclosed by the application of the absorber layer. Interruption of the absorber layer between the individual solar cells is achieved by the mask which is covered as well so that no short circuit currents can occur. A void in the absorber layer above the rear electrode sections on its other side is achieved in the area of the upper ribs and serves for subsequent contacting by the front electrode. Covering the mask at the same time again leads to no loss of material, at the same time the mask too is completely processed up to the absorber layer. After removal of the mask and application of the transparent conductive front layer as an uninterrupted surface the method in accordance with the invention requires only a single subsequent structuring step by mechanical or laser assisted processes. At an interface which includes the upper ribs and a portion of any abutting solar cell, the front layer is simply separated down to the rear electrode at such a separation width as to form a correspondingly structured front electrode without short circuits between individual solar cells. Difficult conversion processes in the absorber layer for forming conductive ribs are avoided. The location of the interfaces is not particularly critical as they need be positioned laterally displaced only in the area of the upper ribs or in the direction of the abutting solar cell. As regards the position of the interfaces it is important to prevent short circuits between the rear and front electrodes. When cutting in the area of the active solar cell this is can be ensured.

The method of fabricating substrate solar cells in principle corresponds to the method of fabricating superstrate solar cells with the exception that the method steps have to be carried out in reverse sequence. However, since the in the case of superstrate cells the transparent conductive front layer for the front electrode on the superstrate is mechanically not as sturdy as the metal layer for forming the rear electrode on the substrate of substrate cells, the mechanical separation step of structuring the front electrode cannot be carried out in the same manner (in this case the scribing would penetrate down to the superstrate). Therefore, in the case of the method of claim 2 the entire transparent superstrate is first covered with a conductive front layer. After the mask has been fixed, structuring is carried out by scribing along the filled surface of the mask in a manner similar to using a ruler so that the mask with one of its lateral margins is positioned directly adjacent to the structuring trenches. Thereafter, the absorber layer is applied and the structuring trenches are also filled with absorber material. Lateral sliding the mask again results in the formation of corresponding upper and lower ribs. Following application of the metal layer for structuring the rear electrode which may also be structured as p-TLO, the mask which by now is also covered by a complete solar cell structure is finally removed. Therefore, the main difference from the method sequence of fabricating a substrate type solar cell resides in the advanced structuring step and the later removal of the mask.

An important aspect of the inventive fabrication method resides in the designing of the mask. Whereas hitherto series-connected solar cells have been structured continuously in stripes without alterations, the invention makes it possible to introduce different designs. Almost any geometric structure, for instance zig-zag or undulating patterns as well as signatures or company logos, may be practiced by adherence to two simple marginal conditions. These are, on the one hand, the basic character of the structure which must be composed of individual smaller partial surfaces. Such "digitizing" of analog structures does not, however, limit the optical function, as from a certain distance it is no longer visually distinguishable if it is not a deliberately applied element of the geometric pattern. When segregating the structure into small partial surfaces their size, as the second condition, must be calculated such that any blank surfaces and, if applicable, any filled surfaces in the geometric pattern must be of approximately the same size. In this manner, any current irregularities are avoided which would occur in case of partial surfaces of different sizes. Uniformity of the filled surfaces is always required whenever—as set forth infra—the mask, too, is to be further processed into a complete solar cell. However, the size of the filled surfaces may be different from that of the blank surfaces. The second marginal condition does not pose any significant problem in its realization as it may simply be incorporated into the arrangement of the solar module.

The possibility of providing a relatively unrestricted design for the mask required for the fabrication method makes it possible to integrate a completely novel aspect into the application of solar modules fabricated in accordance with the invention. Because of their function, the solar modules are usually arranged in the visual range at any rate. It is now possible to utilize solar modules fabricated in accordance with the invention as esthetic design elements for walls of buildings and as advertising media, thus significantly increasing their usefulness. Normally, the geometric pattern would consist of rectangular and straight-line narrow stripes. In order to keep them together within the mask, the mask may at its margins be provided with connecting ribs. During the application of individual layers for fabricating the solar module, the connecting ribs may be arranged outside of any given support layer. If for reasons of geometry this is not possible or where the geometric pattern requires connecting ribs in its interior, particularly to achieve sufficient mechanical sturdiness, such ribs would during the process sequence initially form jumpers. Depending upon the complexity of the geometric pattern it is thus useful, in accordance with an improvement of the inventive method, to provide for an additional method step following method steps (1.8) or (2.8): (A) Structuring short circuit areas in the front layer generated by connecting ribs in more complex geometric patterns.

The individual layers may be provided by generally known methods, such as, for example, vapor deposition or sputtering. The composition of the required layer package for a solar module in thin-film technology fabricated in accordance with the invention arising is a function of the materials used and of the applications. More particularly, prior to applying the rear or front electrode in method step (1.2) or (2.1) the following additional method step may optimally be provided in a further advance of the invention: (B) Application of a barrier layer for forming a diffusion barrier. This may be a Cr layer which prevents an interdiffusion, for instance, of Na. Furthermore, following application of the metal layer (1.3) or following structuring of the front layer (2.4) the following additional method step may be optimally provided: (C) Application of an adhesion and/or source layer for forming an adhesive agent. For instance, this may be a Na-source layer (NaF) and/or an adhesion-assist layer of, for instance, ZnSe or ZnS. Finally, another method step may be optimally introduced between the absorber forming coating and the application of the front layer, i.e. prior to method step (1.6) or (2.5): (D) Applying at least one buffer layer for forming a space-charge zone. This layer may consist, for instance, of CdS or of ZnS.

Depending upon the future application of the finished solar module, an application of transparent materials for forming the substrate or superstrate layers and/or the metal layer may be provided for as a further advance of the method in accordance with the invention. This would yield a special applicability for windows and semi-transparent areas and would take advantage of the fact that large-surface glass panes make are usually used at any rate as substrates or superstrates for thin-film solar cells. The material for forming the transparent metal layer may, for instance, be ZnO, SnO or ITO (indium tin oxide), which in addition to other layers of different doping may also be used for forming the transparent conductive front layer (TLO). By contrast, non-transparent metall layers may consist, for instance, of molybdenum, wolfram (tungsten) or of another metal.

Finally, for forming the absorber layer, which also is non-transparent, a further advance of the method in accordance with the invention may provide, depending upon the support layer, for the use of amorphous, poly- or monocrystalline silicon, polycrystalline CdTe or chalcopyrite compounds of the general formula $Ag_xCu_{1-x}In_yGa_{1-y}S_zSe_{2-z-w}Te_w$ as the semiconductor material, wherein x and y may assume values between 0 and 1, and z and w may assume values between 0 and 2 such that the sum of w+z does not substantially exceed 2. The mask may consist of different materials which provide for the requisite mechanical sturdiness. For forming substrate cells the mask may be made as a metal mask. In principle, the mask need not be transparent as it will be covered by the non-transparent absorber layer. A transparent but not necessarily metallic mask may be used for fabricating superstrate cells if a separate use of the mask is intended as a positive. However, before releasably fixing such a mask, which may consist, for instance, of glass or transparent plastic resistant to the method, on the superstrate, it must first be prov at its upper surface with a transparent front electrode (TLO). Such coating may, for instance, be carried out in a manner similar to the coating for forming the rear electrode of substrate cells.

The essential improvement and simplification of the method are accomplished by the method in accordance with the invention by the use of the mask which may be structured in accordance with predetermined wishes and marginal conditions. This allows elimination of a number of structuring processes as separate method steps. In particular, the lateral shifting of the mask eliminates two otherwise necessary scribing steps. The measure of lateral shift is a spacer for covering from below the section of the electrode at the one side to provide access for the next coating, and for covering from above at the other side to provide a void from the next coating. The size of the covers from, below and from above relates to the overall dimensions of the structured solar cells and is to ensure an assured cover on the one hand and an assured separation on the other side. In accordance with a further advance of the method is it thus advantageous laterally to shift the mask by about 0.1 mm. Technically it is simple to execute and ensure such shifting, and it does not require any in the setup of the method between individual method steps.

In the method according to the invention the mask assumes a significant role at different aspects. Its direct coprocessing leads to no losses in material. It is useful repeatedly to reuse masks, particularly those of complex geometric structures and, therefore, higher costs, without intermediate reprocessing. Layers of insignificant material deposits applied during prior method cycles do not interfere. When, in the end, a mask is not used anymore, the applied material may be recycled which is of particular importance in large scale productions. In addition to these and those advantages described supra the mask has the further inherent advantage that it may be used as a positive for its own configuration, separate from the large-surface solar module which is configured quasi as a negative of the form of the mask. For that reason, in accordance with a further advance of the method in accordance with the invention it is of overall advantage repeatedly to use the mask or further to process a removed mask the filled surfaces of which must then be configured to have uniform surfaces. This does not result in another method sequence; processing on the substrate or superstrate and the mask continue identically. Since the mask may also be used no material is lost at any step in the method and the relatively expensive material are optimally used. Furthermore, the usability supports esthetic considerations in which the geometric structures, in particular company logos, may also be used as a positive. With structures of lesser complexity, the mask may yield individual solar cells of simple geometry which by simple series connections may be combined to solar modules (see infra). However, in accordance with a further advance of the invention, care must be taken when defining the geometry that it provides for an esthetically and/or informally oriented geometric pattern of individual solar cells adhering to partial patterns of identical surface size in its blank surface and/or in its filled surfaces. In this manner, the solar cells on the negative as well as the solar cells on the positive each contribute an identical current thus avoiding the occurrence of current irregularities. It is not necessary that the surfaces of the filled surfaces and of the blank surfaces be identical. In accordance with a further aspect of the invention, additional design aspects may be realized by partial patters of different colors whereby the selected colors must be such that they can be integrated into the photovoltaic process.

In addition to esthetic considerations in solar modules fabricated in accordance with the invention, the optimizing aspects regarding power maximizing or surface minimizing referred to supra have to be taken into consideration. In an embodiment of the solar module fabricated in accordance with the invention, it is particularly advantageous in support layer types to provide a light-collecting concentrator module consisting of individual concentrators as image-forming or non-image-forming optical elements the arrangement of which matches the arrangement of the individual solar cells. The use of concentrators makes possible a significant increase of the average and total energy conversion efficiency of a solar module. The optical elements may, for instance, be lenses of conventional semi-convex or Fresnel-like configuration. In accordance with a further embodiment the solar module may at its light-impinging surface be encapsulated by a transparent glass or plastic material with or without transparent cover pane and the concentrators are integrated in the glass or plastic or are applied to or ground into the interior surface of the cover pane. In particular, the application may be an adhesive one. Structuring of the exterior surface is disadvantageous, however, as it complicates cleaning and the effect of weather and dirt may adversely affect the collecting action of the concentrators. Preferably, the concentrators used may have a geometric concentration factor of $C_g$ which lies within a numerical range between 1 and 10. Such concentrator modules are in principle well known and have been described in detail supra in connection with the state of the art. But in connection with solar modules made in accordance with the inventive method several interesting combinations are possible. For instance, in accordance with a further embodiment of the invention, the concentrator may be arranged at a distance from the solar module of solar cells structured as laterally straight lines in the manner of a Venetian blind, the individual slats of which are constituted by linear concentrator lenses which may be arranged to track the position of the sun. Such arrangements are particularly suitable for mounting in a window, particularly those exposed to strong sunlight. Since the solar module itself may be made to be semi-transparent it may thus contribute to shadowing an interior room. An advantageous embodiment of the solar blind may be characterized by the fact that each concentrator lens is suspended at each end by two supports linked to two guide rails which extend in guide slots fixed relative to the solar module in mounting blocks and may be adjusted simply by pressing movable wedge blocks. Thus all lenses may be adjusted in common. Furthermore, the concentrator lenses follow a path such that at different light exposures their correct adjustment relative to the solar cells is ensured.

In connection with the use of the mask as its own solar cell support another embodiment of the invention may provide for a solar module formed from the mask and for series connecting the electrodes of the individual solar cells by way of an integrated metallized contact ribbon. In such an arrangement, the contact ribbon may be structured as a transparent flexible contact foil the width of which corresponds to the entire width of the solar module. In addition, the solar module may be slidably mounted by lateral winding and unwinding of the contact foil extending beyond the solar module, in front of or behind (depending upon the type of solar cell) a further structured and integrated series-connected solar module which is mounted stationarily. Depending upon the individual solar modules relative to each other a selection may be made between maximum light transmissivity and maximum current production. Such measures result in a partially transparent solar module with variable shadowing which may be structured according to esthetic considerations. Overall, by an optimum combination of esthetic and functional structural elements, a solar module fabricated by the method of the invention and modified optimally relative to its power output may arranged by itself or in common with other solar modules in front of or within windows, wall and roof elements of a building, or in the interior thereof. The degrees of transparency of the solar modules used may be matched with those of the building surfaces, and they may be changeable, for instance, fully transparent in front of windows disposed in the shade and in front structural elements made of glass, semi-transparent in front of windows exposed to the sun, and non-transparent in front of building walls, in roof areas and when used as sun screens. When used as semi-transparent solar modules, the surface to be covered by the solar cells may be significantly reduced by an application of concentrators. This leads to greater flexibility for architectural designs. The small distance between the solar and concentrator modules makes possible the manufacture of ready-to-use inserts used in the construction of buildings without requiring a significant increase in the space used for conventional solar modules. Completely new fields of application are being opened up which should make the use of solar modules—even within building—much more attractive. In order to avoid repetitions regarding the mentioned modifications reference may be had to the following specific description for further details.

DESCRIPTION OF THE SEVERAL DRAWINGS

The novel features which are considered to be characteristic of the invention are set forth with particularity in the appended claims. The invention itself, however, in respect of its structure, construction and lay-out as well as manufacturing techniques, together with other objects and advantages thereof, will be best understood from the following description of preferred embodiments when read in connection with the appended drawings, in which:

DETAILED DESCRIPTION OF THE PREFERRED EMBODIMENTS

Figure 1:
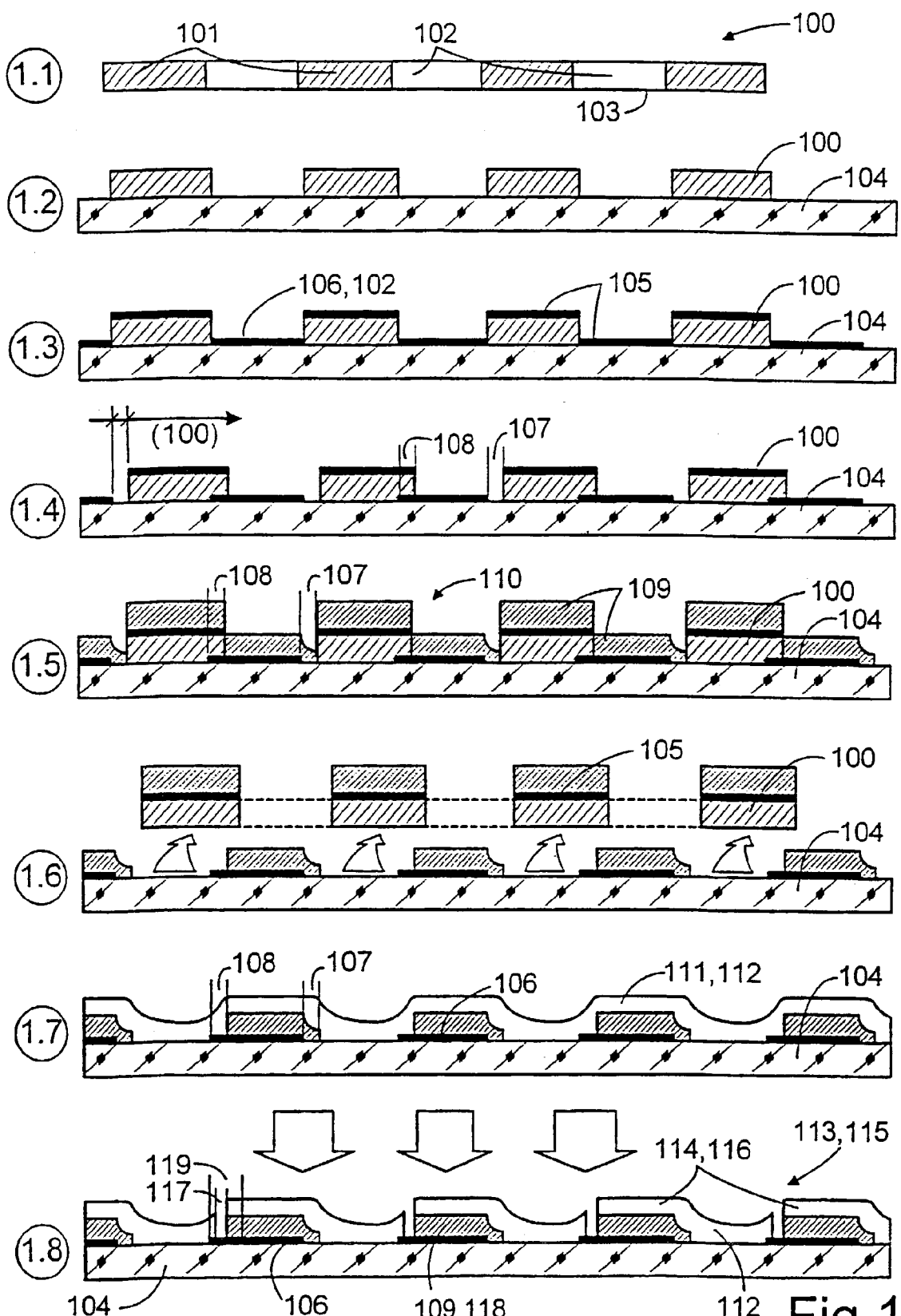
FIG. 1 depicts the sequence of the inventive fabrication method of a substrate cell.

In FIG. 1 the method in accordance with the invention is depicted on the basis of selected states of fabrication of an embodiment of a solar module to be fabricated shown in cross section. A thin-film mask 100 corresponding to the desired geometry and adhering to the predetermined marginal conditions is fabricated in a first method step 1.1. The embodiment shown is one of comb-like geometry having filled surfaces 101 and blank surfaces 102 of identical size. Connecting ribs 103 in the geometric pattern lie outside of the solar cell structure to be fabricated and are not given further consideration. In a method step 1.2 the mask 100 is releasably fixed on a transparent substrate layer 104 of glass. In a next method step 1.3 a metal layer 105 is applied to the substrate layer 104 and the fixed mask 100. This leads to the formation on the substrate layer 104 of a rear electrode 106 structured in stripes shaped like the blank spaces 102 in the geometric pattern of the mask 100. In method step 1.3 a metal layer 105 is also deposited on the filled surfaces 105. In the following method step 1.4 the mask 100 is laterally shifted, for instance by about 0.1 mm, across the striped rear electrode 106 in the direction of the arrow. At this point it is to be mentioned that for the sake of a clear presentation the dimensions have been shown in distorted fashion. The lateral shifting leads to the formation of narrow lower cover ribs 107 and narrow upper cover ribs 108.

A photovoltaically active thin semiconductor layer 109, for instance of the chalco-pyrite compound $CuInS_2$ is deposited in a next method step 1.5 on the substrate 104 and the laterally shifted mask 100. This leads to the formation of a structured absorber layer 110 over the mask 100 which also covers the lower cover rib 107; but it does not cover the upper cover rib 108. In this manner the striped rear electrode 106 in the area of the lower cover rib 107 becomes encased by the semiconductor layer 109 while remaining exposed in the area of the upper cover rib 108. The mask 100 is released and removed in method step 1.6. Thereafter, it may be processed further separately but in parallel into a "positive solar module" and differs from the "negative solar module" only by the absence of the substrate layer 104 which is, however, mechanically replaced by the mask 100. A transparent conductive front layer 111 which forms the front electrode 112 is applied in the following method step 1.7 on the substrate 104 in the area now vacated by the removal of the mask 100 and in the area of the upper cover rib 108 on the rear electrode 100 as well as, but separate therefrom, on the removed mask 100. In this manner, the separated mask 100 is fully processed and initially forms an unconnected solar module 113 of individual thin-film solar cells 114 in the form of the filled surfaces 101 of the geometric pattern without the connecting ribs thereof. The solar module 113 may then be finishes (analogously in FIGS. 3 and 5) by subsequent suitable connection processes which may be carried out with relative ease and in integrated manner because of the lacking substrate layer 104 and the downwardly exposed metal layer 105. In the inserted state light impinges on the substrate 104 in the direction of the arrow.

On the "negative" solar module 115 the front electrode 112 is initially unstructured and electrically short circuits all solar cells 116. Therefore, in an ensuing method step 1.8 the front layer 111 is thus opened in areas 119 of separation of the upper cover ribs 108 down to the striped rear electrode 106 by a suitable scribing process, for instance by a laser beam by gaps 117 which eliminate the short circuits. Generally the rear electrode 106 adheres more firmly to the substrate layer 104 than does the absorber layer 109. Thus, the solar cells 116 are electrically series connected in an integrated manner with the individual absorber layer strips 118 remaining electrically insulated. The solar module is thus finished and ready for use.

Figure 2:
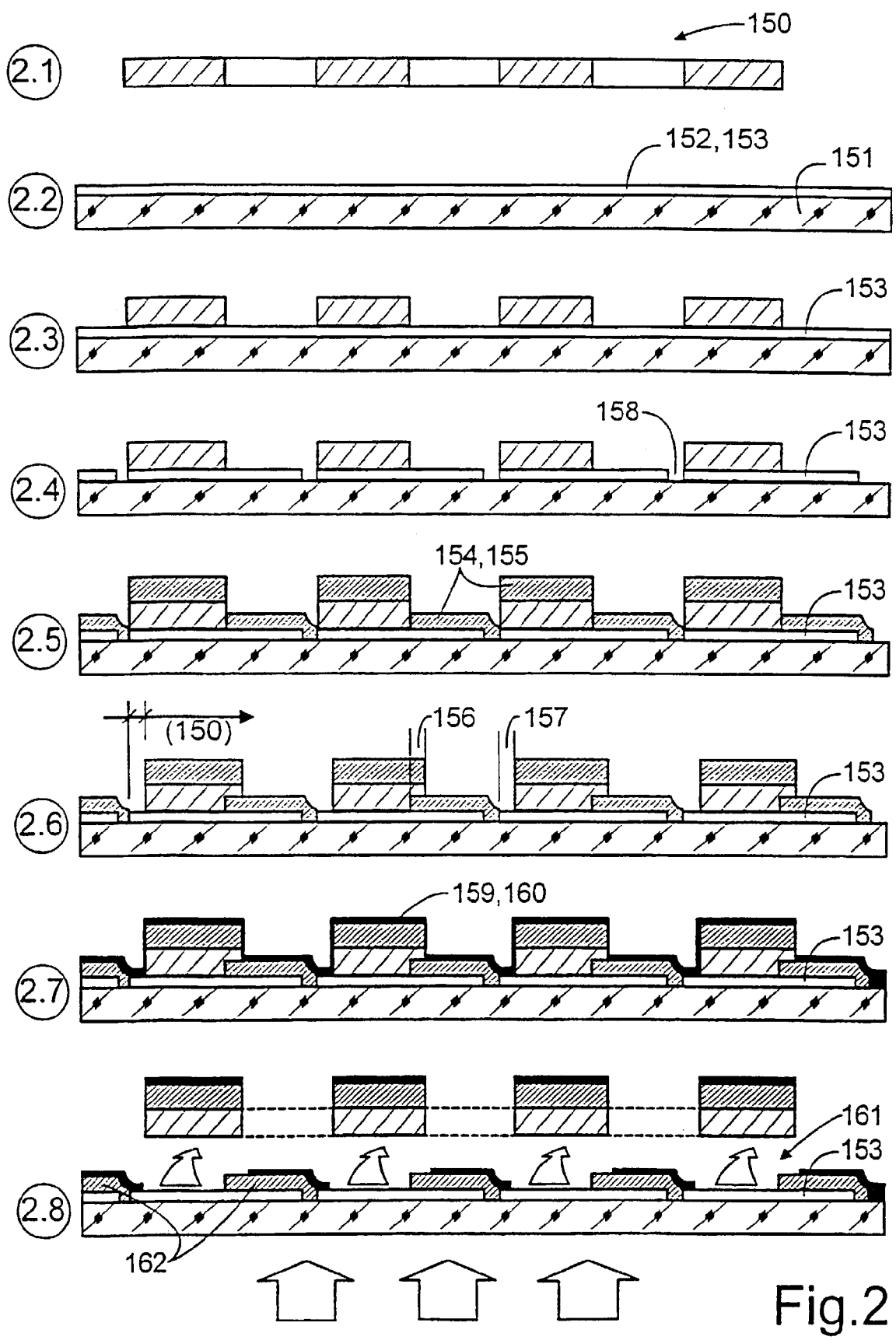
FIG. 2 depicts the sequence of the inventive fabrication method of a supertrate cell.

The inventive method of fabricating superstrate cells is analogously shown in FIG. 2. In a first method step 2.1 a thin mask 150 is again provided in accordance with a predetermined geometric pattern. If subsequent reuse of the mask is planned as a proper solar module, it is made of a transparent material and on its upper surface it is provided with a separately applied front electrode which has not been shown in the figure. In an ensuing method step 2.2 a transparent conductive front layer 152 for forming a front electrode 153 is applied on a substrate 151. In the embodiment selected the front electrode 153 consists of a plurality of SnO layers of different doping (ITO or ZnO are possible). Thereafter, the mask 150 is releasably fixed on the front layer 152 (method step 2.3). Thereafter, in method step 2.4 the scribing of the front layer 152 is performed along the outer margins of the mask 150 functioning as mechanical or optical rulers, in order to structure the front electrode 153. In a next method step 2.5 a semiconductor layer 154 is applied for forming an absorber layer 155 structured in correspondence with the geometry of the mask. In the manner of the method described supra, the mask 150 is then, in method step 2.6 laterally shifted by a small distance of about 0.1 mm. Thus, upper cover ribs 156 and lower cover ribs 157 are formed. In the ensuing method step 2.7 these are covered, exactly like the scribed structuring trenches 158, by a metal layer 159 for structuring a rear electrode 160. In a last method step 2.8 the mask 150 is removed. The solar module is finished with a corresponding structuring and integrated series connection between individual thin-film solar cells 162. In an inserted state light impinges through the superstrate 151 in the direction of the arrow.

Following the description of the two analogous methods of fabricating substrate and superstrate cells, solar modules fabricated by the method are to be described hereinafter in greater detail in connection with the use of concentrator modules. This will always be based on the substrate cell type. It is, however, expressly to be mention at this point that all embodiments may also be executed on the basis of superstrate cells after appropriate conventional technical adjustment.

Figure 3:
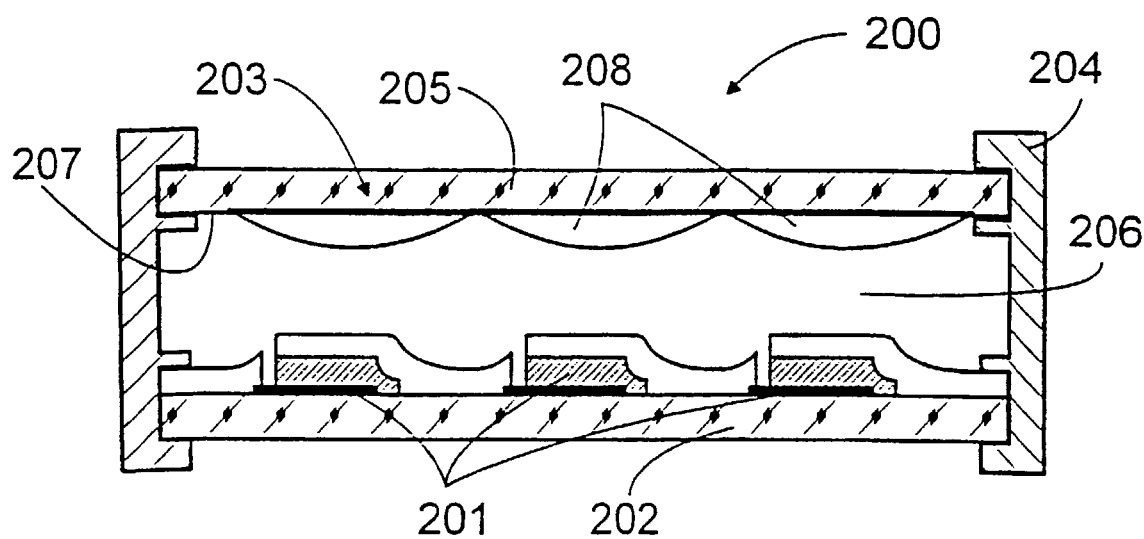
FIG. 3 depicts a solar module fabricated by the method and consisting of substrate cells with a concentrator module.
Figure 6:
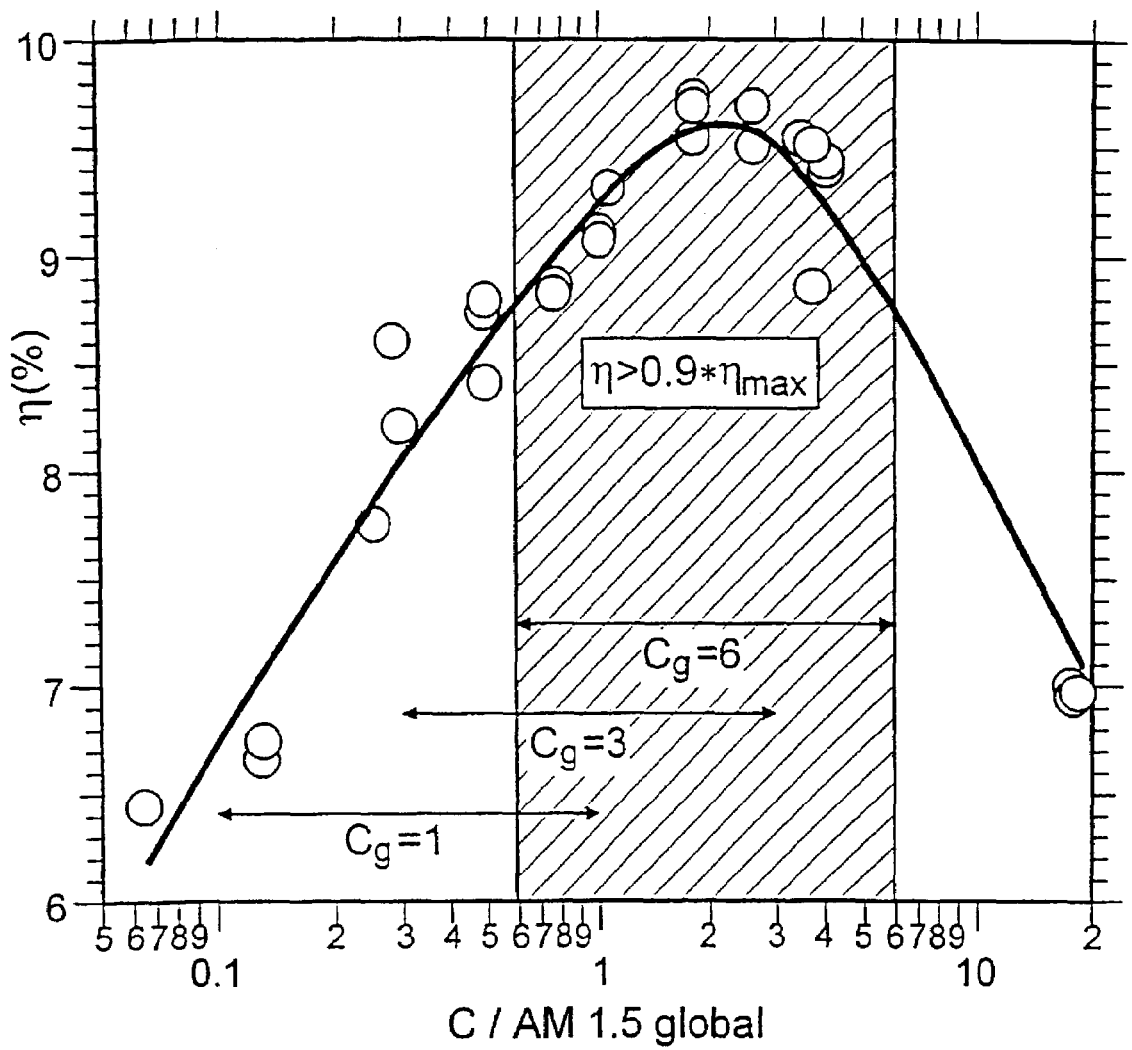
FIG. 6 depicts a diagram showing the effect of the concentrator modules.

FIG. 3 (the meaning of reference numerals not explained here and in the following figures may be taken from FIG. 1 or any preceding figure) depicts a solar module 200 fabricated by the inventive method, in a partially transparent embodiment with laterally structured solar cells 2001 on a transparent substrate 202 and a light-collecting concentrator module 203 as integrated light concentration. Such a solar module 200 may be used, for instance, as a window or as an element of demanding architectural facades. In the selected embodiment, an enclosure which required by every standard thin-film solar module in order to be protected from weather conditions, is realized by a housing 204 which also serves to divert the generated current, and by a glass plate 205 behind which is provided a transparent plastic 206 (e.g. epoxy or artificial resin) for filling the intermediate space. The concentrator module 203 is arranged at the interior surface 207 of the glass plate 205 and is provided with individual concentrators 208 which in their arrangement are matched to the arrangement of the individual solar cells 201. In the selected embodiment they are strip-like semi-convex lenses adhesively attached to the interior side of the glass plate 205. Reference should be had to FIG. 6 for an explanation of the effect of the concentrators.

Figure 4:
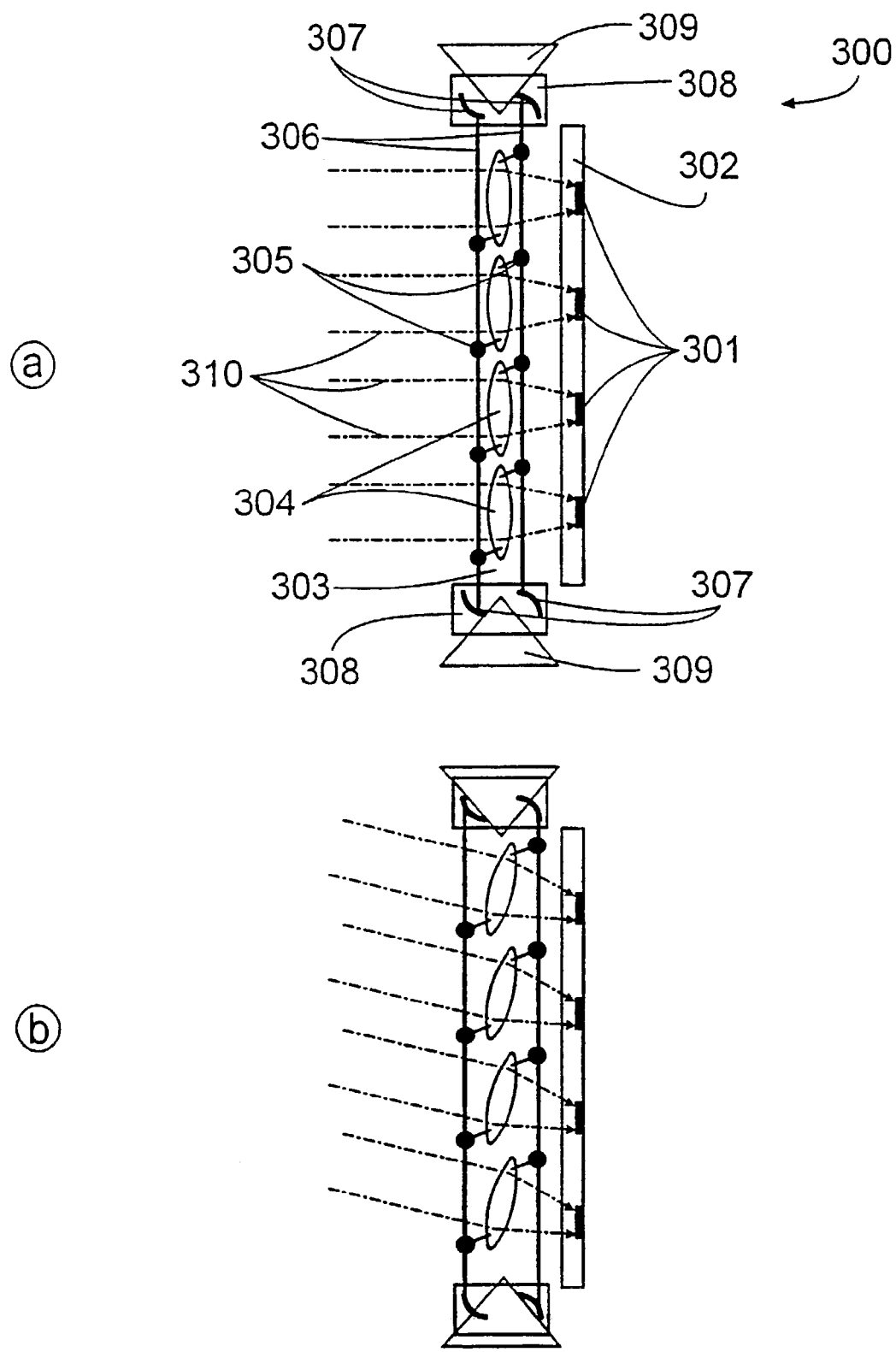
FIGS. 4a, 4b depict a solar module in two positions, fabricated by the method and consisting of substrate cells with a concentrator module structured in the manner of a Venetian blind.

FIG. 4 depicts an embodiment of a partially transparent solar module 300 with solar cells 301 structured as straight lines on a transparent substrate 302 and provided with a concentrator module 303 structured as a solar Venetian blind including tracking linearly focusing concentrator lenses 304. The solar cells 301 are arranged behind the separately suspended blind-like concentrator module 303. This consists of as many lamellate linearly focusing concentrator lenses 304 as there are strip-like solar cells 301 within the solar module 300. Each concentrator lens 304 is attached at its two ends by way of two shanked suspension points 305 to two guide bars 306 which in turn extend through guide slots 307 in mounting blocks 308. The position of the mounting blocks 308 is stationary with respect to the solar module 300 so that an individual adjustment of the concentrator lenses 304 is avoided. The guide bars 306 are adjusted in the guide slots 307 by simple pressure of movable wedge blocks 309. In this manner the concentrator lenses 304 follow a path which ensure an appropriate adjustment relative to the solar cells 301 at different incidents of light. The incident of light has been indicated by dash-dotted lines for two different angles of incident in the upper (a) and in the lower portion (b) of FIG. 4. It is to be noted, firstly, that this kind of light concentration is particularly suitable for superstrate cells in which the integration of the concentration into the solar module encounters difficulties and, secondly, that both the angle of inclination of the concentrator lenses 304 and the position of their center of gravity are tracked correctly. The positioning signal for the tracking may be obtained in a simple manner from the current output of the solar cells 301. In the present embodiment the shape of the lateral pattern of the solar cells 301 has to be a straight-line one so that proper irradiation by the concentrator lenses 304 may be ensured. It is possible, however, depending upon the desired geometric concentration ratio to select a mark space ratio between solar cell and free space different from 2:1.

Figure 5:
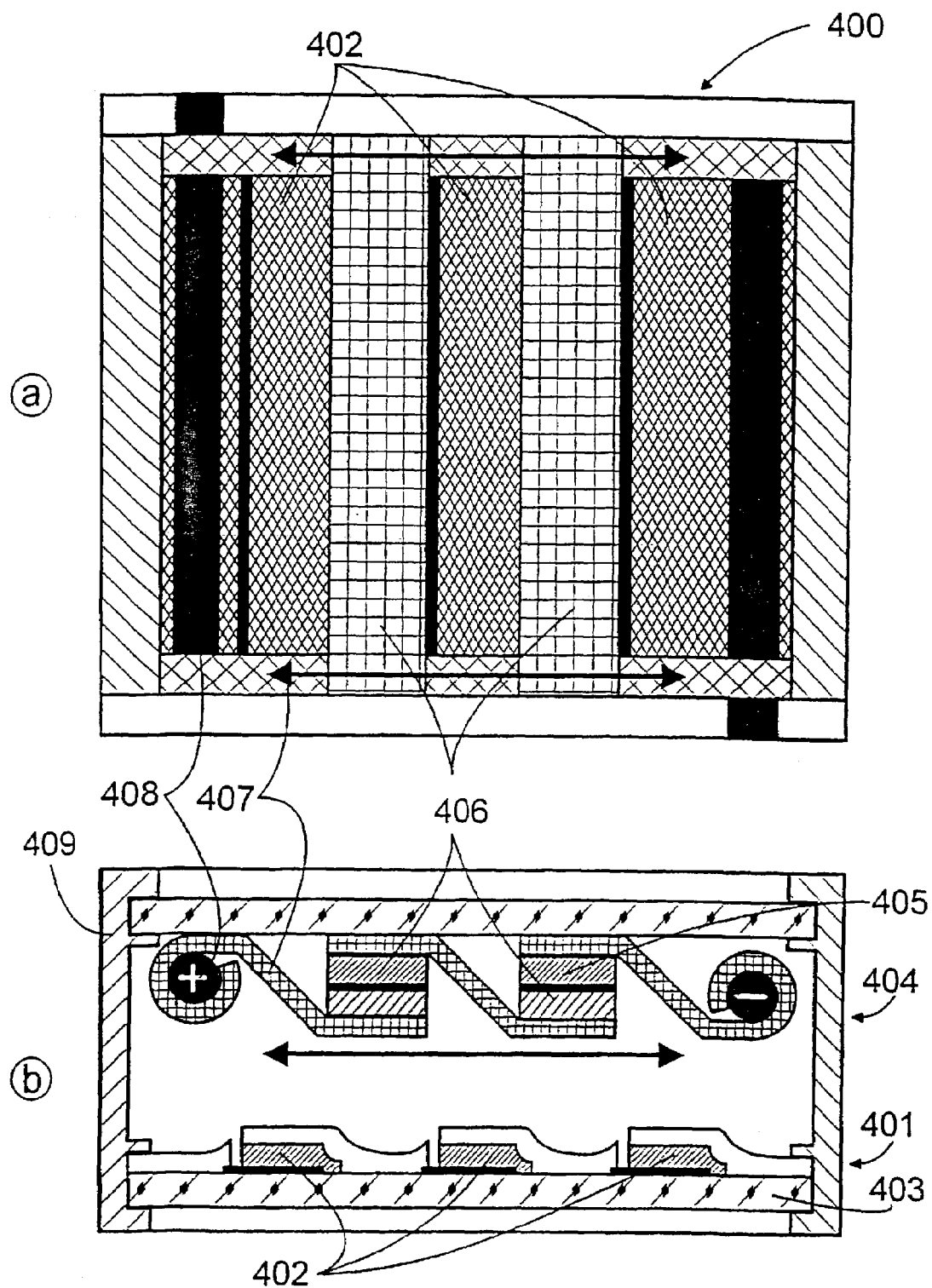
FIGS. 5a, 5b depict in planar view and in section a solar module fabricated by the method and consisting of substrate cells of variable shadowing.

FIG. 5 depicts a partially transparent laterally structured combination solar module 400 with variable shadowing, in a planar view at (a) and cross-section at (b). The combination solar module 400 consists of a stationary solar module 401 constructed of rigid solar cells 402 on a transparent substrate 403 and, arranged above the stationary solar module 401, of movable solar module 404 realized on a striped mask 405. Solar cells 406 prepared on the mask 405 are electrically series-connected to each other by a flexible transparent contact foil 407 between the front and back sides of the striped solar cells 406. The surface of the contact foil 407 is metallized by a transparent conductive oxide. Thus, the contact foil 407 may be spread over the entire width of a window, thus resulting, on the one hand, in a low series resistance loss and, on the other hand, in increased mechanical sturdiness of the flexible solar module 404. Each end of the connecting contact foil 407 is wrapped over a cylindrical body 408 which also serves as outward electrical feed. The cylindrical body 408 is suspended in a frame element 409 and may be rotated from the exterior so that the flexible solar module 404 may be moved laterally. In this manner, the stationary solar module 401 on the glass substrate 403 may be selectively shaded, rendering the window semi-transparent at low current generation. Otherwise, the spatially variable solar cells 406 are positioned between the rigid solar cells 402 of the stationary solar module 401 which renders the windows totally opaque and current generation is maximized. In a variation of this embodiment it would not be necessary to structure the solar cells 402, 406 as straight-line stripes; rather, they may also be structured according to esthetic aspects as long as their surfaces satisfy the general marginal conditions and, for such application, are congruent as well. At this point it must also be mentioned that if superstrate cells were used the movable solar cells would have to be placed beneath the stationary solar cells.

Since the distance between the concentrators and the solar cells in the selected embodiments is relatively small, the concentrators will provide for low light concentration only, which in thin-film solar cells nevertheless results in a significant improvement of the average efficiency. FIG. 6 depicts a typical measuring curve of the efficiency of a chalco-pyrite solar cell as a function of light concentration from which three characteristic facts may be derived:

1. The average spectral irradiation energy at noon on a summer day is internationally approached by the AM 1.5 global spectrum according to IEC norm 904-3 (1989) to be mentioned at this point. An our latitude, light conditions are prevailing in which the light intensity may vary by as much as factor 10 between summer and winter on the one hand and as a result of variable cloudiness on the other hand. Hence, in its operation the solar cell is subjected to an irradiation energy of about 10%–100% of the energy which in accordance with AM 1.5 is to be expected globally.

2. The energy efficiency relating to the irradiation intensity is varying such that an operation at low irradiation levels is not favorable. Thus, in the solar cell shown in FIG. 5 an efficiency of $\eta=9.2\%$ at an irradiation of AM 1.5 global (C=1); however, at 10% of that irradiation (C=0.1) the energy efficiency is only $\eta=6.5\%$. The optimum efficiency of this solar cell, $\eta=9.5\%$, is reached only at a concentration of C=2–3.

3. By using light concentrators of low geometric concentration factors $C_g$ the irradiation level to be expected during operation is shifted into a range favorable to thin-film solar cells. FIG. 6 depicts three possible concentration factors $C_g=1, 3, 6$, and it becomes apparent that at a light incidence of 10%–100% of the standard sun AM 1.5 global, the average efficiency of this typical solar cell remains in excess of $\eta=8.8\%$, i.e. above 90% of the efficiency of 9.7% which may be achieved with this cell, at a six-fold light concentration of $C_g=6$. A shift of the maximum to higher concentrations may be expected at an increased optimization of the properties of the solar cell (lowering of the series resistance).

Overall, the use of concentrators of a geometric concentration factor $C_g$ in a numeric range between 1 and 10 is favorable. In most cases, a geometric concentration $C_g=6$ is entirely sufficient to ensure an optimum efficiency. This low value renders the use of cost-efficient plastic Fresnel lenses in combination with chalco-pyrite cells particularly interesting. In such an arrangement, a solar cell typically measuring from between 0.5–5.0 cm² rather than being placed precisely into the focal point of the Fresnel lens, is placed about 0.5 cm ahead of it thus rendering the illumination of solar cell homogeneous. Further measures to increase the concentration such as, for instance, expensive secondary concentrators of the kind necessary for Si or GaAs cells are not necessary for amorphous and poly or microcrystalline solar cells.

What is claimed is:

1. A method of fabricating a solar module with structured and integrated series-connected thin-film solar cells on a substrate; comprising the sequence of the following steps:
    (1.1) providing a thin-film mask according to a predetermined geometric pattern of filled surfaces with integrated blank surfaces of uniform size;
    (1.2) releasably fixing the mask on a substrate as support layer;
    (1.3) applying a metal layer for structuring a rear electrode in the shape of the blank surfaces in the geometric pattern of the mask;
    (1.4) laterally shifting the mask across the structured rear electrode for forming narrow upper cover ribs in the direction of the shift and lower cover ribs in a direction opposite the shift;
    (1.5) applying a photovoltaically active thin semiconductor layer of amorphous or poly or microcrystalline semiconductor material for forming a structured absorber layer;
    (1.6) releasing and removing the mask;
    (1.7) applying a transparent conductive front layer of at least one layer for forming a front electrode; and
    (1.8) structuring the front layer in separation areas of the upper cover ribs with short circuit eliminating separation gaps down to the metal layer of the rear electrode.

2. The method according to claim 1, further comprising the additional step following step (1.8), of:
    (A) structuring short ciruit areas in the front layer generated by connecting ribs in complex geometric patterns.

3. The method according to claim 1, further comprising the additional step following step (1.2) of
    (B) applying a barrier layer for forming a diffusion barrier.

4. The method according to claim 1, further comprising the additional step following step (1.3) of
    (C) applying an adhesion and/or source layer for forming an adhesive agent.

5. The method according to claim 1, further comprising the additional step preceeding (1.6) of
    (D) applying at least one buffer layer for forming a spatial charge zone.

6. The method according to claim 1, wherein transparent materials are used for forming at least one of the substrate and metal layer.

7. The method according to claim 1, characterized by a support layer dependent use of one of amorphous silicon, polycrystalline silicon, microcrystalline silicon, polycrystalline CdTe and chalco-pyrite compounds of general formula $Ag_xCu_{1-x}In_yS_zSe_{2-z-w}Te_w$ as semiconductor material for forming the absorber layer, wherein x and y may assume values between 0 and 1 and z and w values between 0 and 2 such that the sum of w+z does not significantly exceed the value of 2.

8. The method of claim 1, wherein transparent materials are used for forming the mask.

9. The method of claim 1, further comprising the step of laterally shifting the mask by about 0.1 mm.

10. The method of claim 1, further comprising the steps of at least one of reusing and separately further processing the released mask and of forming the filled surfaces thereof to be of equal size.

11. A method of fabricating a solar module with structured and integrated series-connected thin-film solar cells under a superstrate, comprising the sequence of the following steps:

(2.1) providing a thin-film mask according to a predetermined geometric pattern of filled surfaces with integrated blank surfaces of uniform size;

(2.2) applying a transparent conductive front layer of at least one layer on a superstrate as a support layer for forming a front electrode;

(2.3) releasably fixing the mask on the transparent superstrate layer;

(2.4) structuring the front layer along the filled surfaces in the geometric pattern of the mask down to the superstrate layer;

(2.5) applying a photovoltaically active thin semiconductor layer of amorphous or poly or microcrystalline semiconductor material for forming a structured absorber layer;

(2.6) laterally shifting the mask over the structured absorber layer for forming narrow upper cover ribs in the direction of the shift and lower cover ribs in a direction opposite the shift;

(2.7) applying a metal layer for structuring a rear electrode in the shape of the blank surfaces in the geometric pattern of the mask; and (2.8) releasing and removing the mask.

* * * * *